(12) United States Patent
Bae et al.

(10) Patent No.: US 8,860,035 B2
(45) Date of Patent: Oct. 14, 2014

(54) ORGANIC LIGHT EMITTING DIODE DISPLAY AND MANUFACTURING METHOD THEREOF

(71) Applicant: Samsung Display Co., Ltd., Yongin (KR)

(72) Inventors: Han-Sung Bae, Yongin (KR); Won-Kyu Kwak, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/867,023

(22) Filed: Apr. 19, 2013

(65) Prior Publication Data

US 2014/0138638 A1 May 22, 2014

(30) Foreign Application Priority Data

Nov. 20, 2012 (KR) .................. 10-2012-0131988

(51) Int. Cl.
| | | |
|---|---|---|
| *H01L 33/00* | (2010.01) | |
| *H01L 23/58* | (2006.01) | |
| *H01L 51/56* | (2006.01) | |
| *H01L 51/52* | (2006.01) | |

(52) U.S. Cl.
CPC ............ *H01L 51/5253* (2013.01); *H01L 51/56* (2013.01)
USPC .................. 257/72; 257/40; 257/48; 257/59; 257/79; 257/E21.531; 257/E23.141; 345/76; 345/82; 438/18

(58) Field of Classification Search
USPC ................... 257/40, 48, 59, 72, 79, E21.531, 257/E23.141; 345/76, 82; 438/18
See application file for complete search history.

(56) References Cited

U.S. PATENT DOCUMENTS

| | | | |
|---|---|---|---|
| 7,602,959 B2* | 10/2009 | Song et al. ................ | 382/141 |
| 7,897,965 B2* | 3/2011 | Yoon et al. ................ | 257/48 |
| 7,995,011 B2* | 8/2011 | Jeong et al. ............... | 345/76 |
| 2007/0001711 A1* | 1/2007 | Kwak ....................... | 324/770 |
| 2013/0299850 A1* | 11/2013 | Yoshida et al. ............ | 257/79 |
| 2014/0021478 A1* | 1/2014 | Yanagisawa ............... | 257/72 |
| 2014/0111407 A1* | 4/2014 | Kwon et al. ............... | 345/82 |

FOREIGN PATENT DOCUMENTS

| | | |
|---|---|---|
| KR | 10-0712103 | 5/2007 |
| KR | 10-2010-0089329 A | 8/2010 |

OTHER PUBLICATIONS

Korean Patent Abstracts Publication No. 10-2006-0059076 dated Jun. 1, 2006, for KR10-0712103, 2 pages.

* cited by examiner

*Primary Examiner* — Dao H Nguyen
(74) *Attorney, Agent, or Firm* — Christie, Parker & Hale, LLP (57) ABSTRACT

Disclosed is an organic light emitting diode display including: a substrate including a display area configured to display an image and a peripheral area surrounding the display area; a plurality of pad wires at the peripheral area of the substrate; and an inspection wire having a zigzag form on the plurality of pad wires.

8 Claims, 12 Drawing Sheets

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2012-0131988 filed in the Korean Intellectual Property Office on Nov. 20, 2012, the entire contents of which are incorporated herein by reference.

BACKGROUND

1. Field

The following description relates generally to an organic light emitting diode display and a manufacturing method thereof.

2. Description of the Related Art

An organic light emitting diode display includes organic light emitting elements, each of which includes a hole injection electrode, an organic emission layer, and an electron injection electrode. Each organic light emitting element emits light by energy generated when an exciton generated by a combination of electrons and holes in the organic emission layer falls from an excited state to a ground state. The organic light emitting diode display then generates a predetermined or preselected image using the light emission.

The organic light emitting diode display has light-luminance characteristics and does not require a separate light source unlike a liquid crystal display (LCD), thereby reducing thickness and weight of the display as compared to other displays, such as LCDs. Further, the organic light emitting diode display has high-quality characteristics such as low power consumption, high luminance, fast response speed, and the like and as a result, has been spotlighted as a next generation display device.

The foregoing organic light emitting element may be deteriorated due to internal factors such as deterioration of the organic emission layer due to oxygen from indium tin oxide (ITO) used as electrode materials, deterioration due to reaction between interfaces of the organic material layers configuring the organic emission layer, and the like and may be deteriorated due to external factors such as external moisture and oxygen, ultraviolet (UV) light, and the like. In particular, the external oxygen and moisture fatally affect the lifespan of the organic light emitting element, and therefore a packaging technology of encapsulating the organic light emitting element is beneficial to the lifespan of the organic light emitting element.

The organic light emitting element is manufactured to be thin or bent easily in order to be applied to various applications or surfaces. A thin film encapsulation (TFE) technology has been developed in order to manufacture the organic light emitting element thinly and flexibly. The thin film encapsulation technology is a technology of covering a display area with a thin film encapsulation layer by alternately laminating an inorganic layer and an organic layer of at least one layer on the organic light emitting elements formed in the display area of a substrate. The organic light emitting diode display including the thin film encapsulation layer may be easily bent and slimmed (e.g., made thin), when the substrate is formed of a flexible film.

The organic light emitting element including the flexible substrate is different in manufacturing process conditions from the organic light emitting element including the existing glass substrate and thus may be damaged during manufacturing process conditions designed for a glass substrate.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention provide an organic light emitting diode display and a manufacturing method thereof capable of preventing or reducing the occurrence of defects due to a cutting process.

An exemplary embodiment provides an organic light emitting diode display including: a substrate including a display area configured to display an image and a peripheral area surrounding the display area; a plurality of pad wires at the peripheral area of the substrate; and an inspection wire having a zigzag form on the plurality of pad wires.

The organic light emitting diode display may further include: an upper protective film on the display area, in which the upper protective film is on the plurality of pad wires, and the inspection wire may include a portion crossing one side of the upper protective film on the pad wire.

The inspection wire may include: a pair of inspection pads; a plurality of cross lines between the inspection pads; and a plurality of connection lines connecting between adjacent cross lines.

In one embodiment, the plurality of cross lines are parallel with the plurality of pad wires.

The inspection wire may include: a pair of inspection pads; and a plurality of cross lines connecting between the inspection pads and inclined at an angle greater than 0 with respect to the plurality of pad wires.

The inspection wire may include: a pair of inspection pads; and a portion connecting between the inspection pads and having the form of a curved line.

The organic light emitting diode display may further include: an insulating film between the plurality of pad wires and the inspection wire.

The substrate may be a flexible substrate.

Another exemplary embodiment provides a method of manufacturing an organic light emitting diode display, including: forming a plurality of pad wires in a peripheral area of a substrate including a display area configured to display an image and the peripheral area surrounding the display area; forming inspection wires the plurality of pad wires; attaching a temporary upper protective film to the peripheral area and the display area of the substrate; and cutting the temporary upper protective film along a cutting line with a cutter, the inspection wire having a zigzag form and crossing the cutting line.

The inspection wire may include a pair of inspection pads, a plurality of cross lines between the inspection pads so as to be connected with the inspection pads, and a connection line connecting adjacent cross lines.

At least one of the cross lines may cross the cutting line.

The inspection wire may include: a pair of inspection pads; and a plurality of cross lines connecting between the inspection pads and inclined at an angle greater than 0 with respect to the plurality of pad wires.

The inspection wire may include: a pair of inspection pads; and a portion connecting the inspection pads and having the form of a curved line.

According to the exemplary embodiments, when the inspection wire is formed, it is possible to easily determine whether there are defects in the pad wire occurring during the cutting process.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Embodiments of the present invention will be described more fully hereinafter with reference to the accompanying drawings, in which exemplary embodiments of the invention are shown by way of illustration. As those skilled in the art would realize, the described embodiments may be modified in various different ways, all without departing from the spirit or scope of the present invention and the invention should not be construed as being limited to the embodiments set forth herein.

The drawings and description are to be regarded as illustrative in nature and not restrictive. Like reference numerals designate like elements throughout the specification.

Further, a size and a thickness of each component illustrated in the drawings are arbitrarily shown for convenience of description and therefore the present invention is not necessarily limited thereto.

In the drawings, the thickness of layers, films, panels, regions, etc., are exaggerated for clarity. Further, in the drawings, for understanding and ease of description, the thickness of some layers and areas is exaggerated. It will be understood that when an element such as a layer, film, region, or substrate is referred to as being "on" another element, it can be directly on the other element or intervening elements may also be present.

Further, unless explicitly described to the contrary, the word "comprise" and variations such as "comprises" or "comprising", will be understood to imply the inclusion of stated elements but not the exclusion of any other elements. In addition, throughout the specification, "-on" means one located above or below a targeted portion and does not necessarily mean one located on the top based on a gravity direction.

Further, an organic light emitting diode display according to exemplary embodiments will be described in detail with reference to FIGS. 1 to 6.

Figure 1:
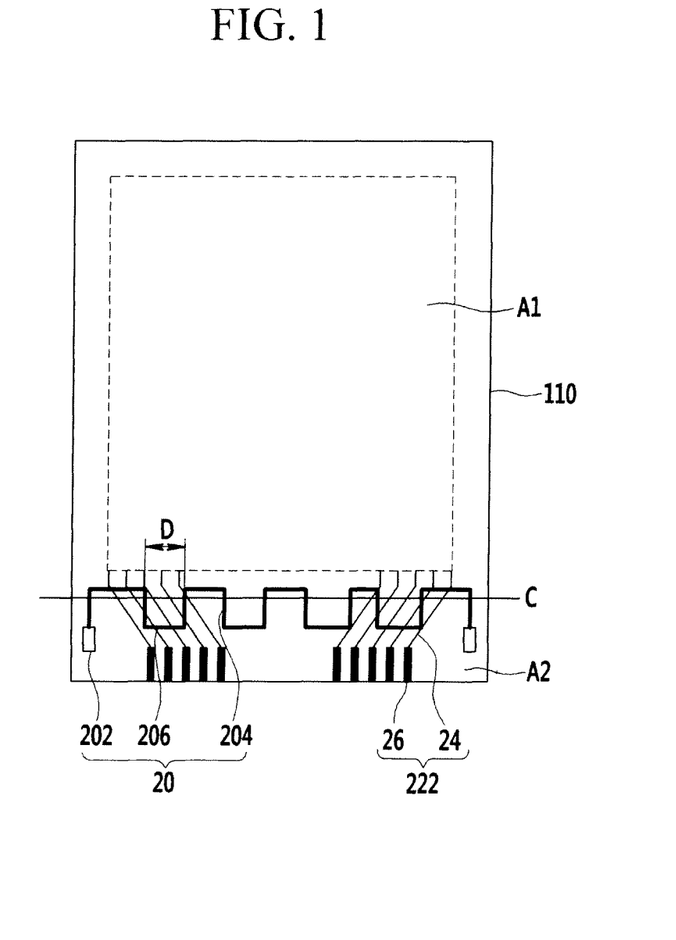
FIG. 1 is a plan view illustrating an organic light emitting diode display according to an exemplary embodiment.
Figure 2:
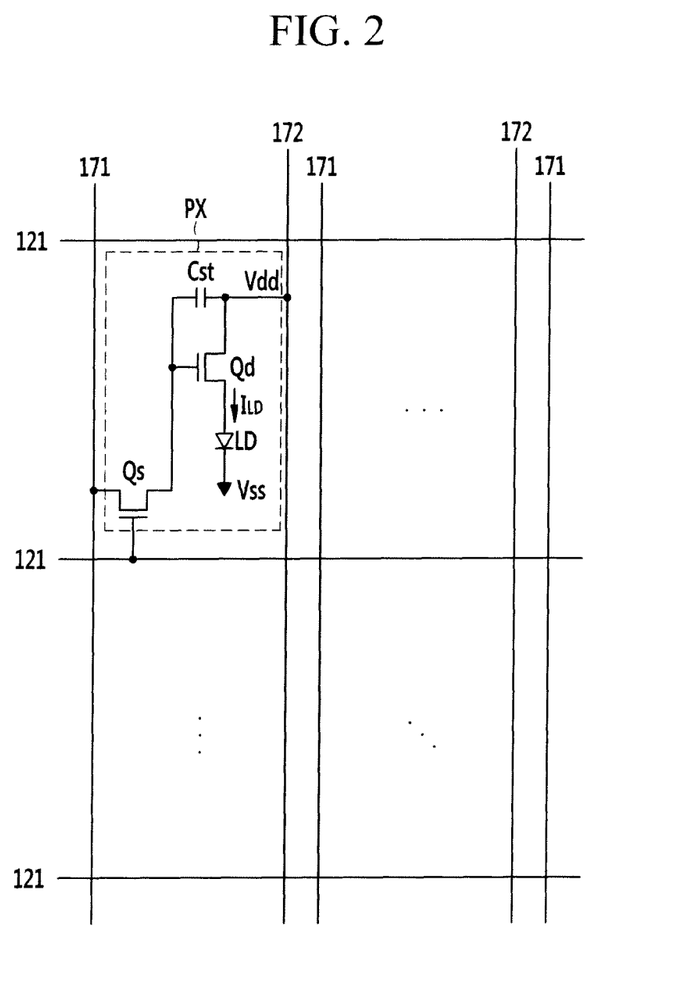
FIG. 2 is an equivalent circuit diagram of one pixel of the organic light emitting diode display according to the exemplary embodiment of FIG. 1.

FIG. 1 is a plan view illustrating an organic light emitting diode display according to an exemplary embodiment, FIG. 2 is an equivalent circuit diagram of one pixel of the organic light emitting diode display according to the exemplary embodiment of FIG. 1, and FIGS. 3 to 6 are plan views illustrating an organic light emitting diode display according to other exemplary embodiments.

As illustrated in FIG. 1, the organic light emitting diode display according to the exemplary embodiment includes a substrate 110 including a display area A1 on which an image is displayed and a peripheral area A2 surrounding (or adjacent to) the display area A1, a plurality of pad wires 222 formed in the peripheral area A2 of the substrate 110, and an inspection wire 20 formed in the peripheral area A2. As used herein, the term "plurality" refers to two or more.

The display area A1 on the substrate 110 includes a plurality of pixels for displaying an image.

Referring to FIG. 2, each pixel PX of the organic light emitting diode display according to the exemplary embodiment includes a plurality of signal lines 121, 171, and 172 and a plurality of pixels PXs connected with the plurality of signal lines 121, 171, and 172 and arranged in an approximate matrix form.

The signal line includes a plurality of gate lines 121 transferring gate signals (or scan signals), a plurality of data lines 171 transferring data signals, and a plurality of driving voltage lines 172 transferring driving voltage Vdd. The gate lines 121 extend approximately in a row direction (as shown in FIG. 2) and are approximately parallel with each other and vertical direction portions of the data lines 171 and the driving voltage lines 172 extend approximately in a column direction (as shown in FIG. 2) and are approximately parallel with each other.

Each pixel PX includes a switching thin film transistor Qs, a driving thin film transistor Qd, a storage capacitor Cst, and an organic light emitting diode (OLED) LD.

The switching thin film transistor Qs includes a control terminal, an input terminal, and an output terminal. The control terminal is connected with the gate line 121, the input terminal is connected with the data line 171, and the output terminal is connected with the driving thin film transistor Qd. The switching thin film transistor Qs transfers a data signal applied to the data line 171 to the driving thin film transistor Qd in response to a scan signal applied to the gate line 121

The driving thin film transistor Qd has also a control terminal, an input terminal, and an output terminal. The control terminal is connected with the switching thin film transistor Qs, the input terminal is connected with the driving voltage line 172, and the output terminal is connected with the organic light emitting diode LD. The driving thin film transistor Qd transfers output current ILD having a size determined according to the voltage applied between the control terminal and the output terminal of the driving thin film transistor Qd.

The capacitor Cst is connected between the control terminal and the input terminal of the driving thin film transistor Qd. The capacitor Cst charges the data signal applied to the control terminal of the driving thin film transistor Qd and keeps the charged data signal even after the switching thin film transistor Qs is turned-off.

The organic light emitting diode (OLED) (LD) has an anode connected with the output terminal of the driving thin film transistor Qd and a cathode connected with common voltage Vss. The organic light emitting diode LD emits light having intensity determined according to the output current ILD of the driving thin film transistor Qd, thereby displaying an image.

Referring back to FIG. 1, the peripheral area A2 is provided with a plurality of pad wires 222 such as a fan-out unit for applying signals to the plurality of signal lines 121, 171, and 172 from the outside. The peripheral area A2 may include more than one plurality of pad wires 222 spaced apart from each other. Each of the pad wires includes a pad connection part 24 and a pad 26 that are each connected with signal lines, such as a gate line, a data line, and a driving signal line. The pad 26 may be electrically connected with an external driver.

Further, the peripheral area A2 is provided with the inspection wire 20. The inspection wire 20 is formed in a zigzag form based on a cutting line C.

In detail, the inspection wire 20 includes a pair of input terminals 202, a plurality of cross lines 204 and a plurality of connection lines 206 connecting between the input terminals.

At least one cross line 204 crosses the cutting line C and at least one connection line 206 connects between adjacent cross lines 204.

In the embodiment shown in FIG. 1, the cross lines 204 are spaced apart at a predetermined or preselected interval D, such that each of the connection lines 206 has the same length.

Figure 3:
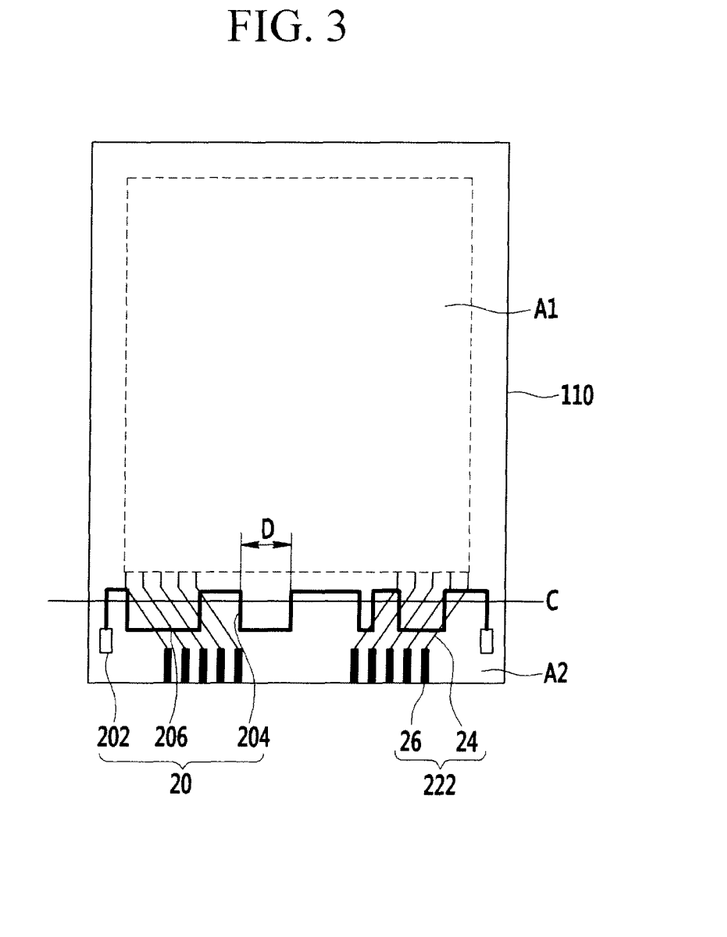
FIGS. 3 to 6 are plan views illustrating an organic light emitting diode display according to other exemplary embodiments.

However, as illustrated in FIG. 3, the cross lines 204 may be formed at various intervals. For example, the inspection wire 20 connects between the inspection pads 202 and has at least one cross line crossing the cutting line C and the number of cross lines and the number of connection lines may be varied as desired.

Figure 4:
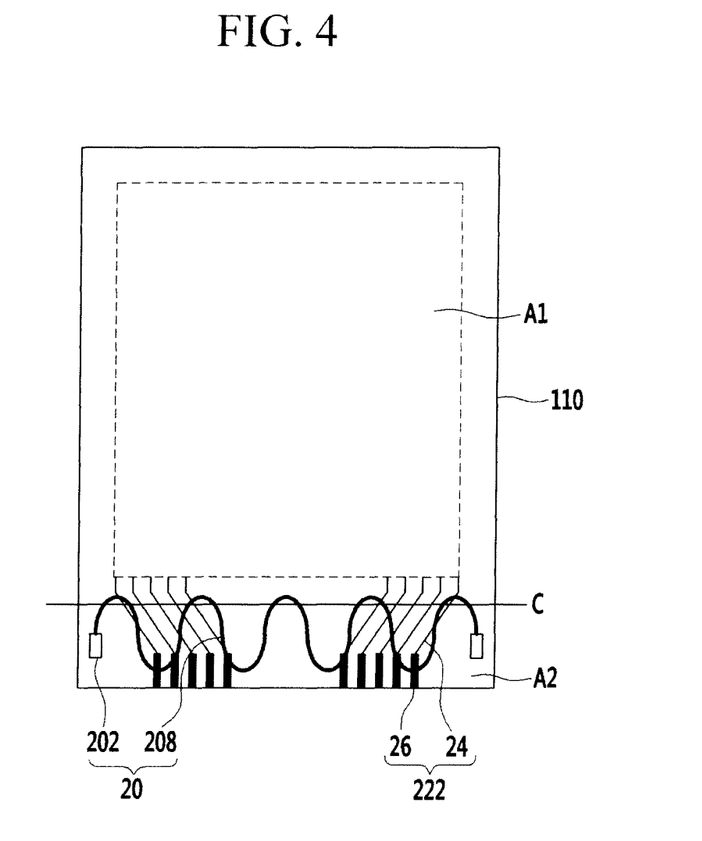
Figure 5:
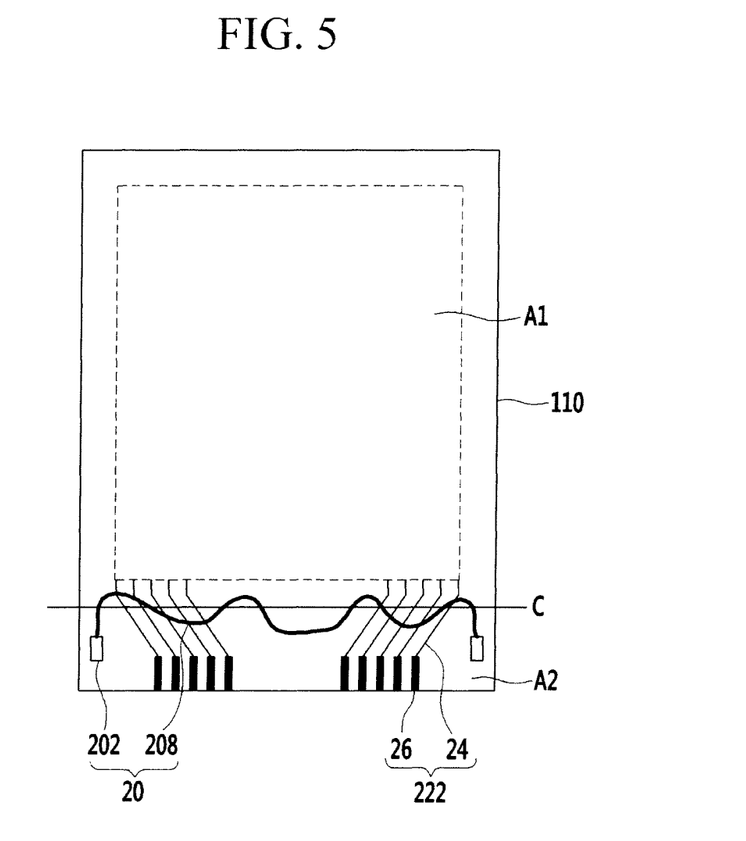

Meanwhile, as illustrated in FIGS. 4 and 5, the inspection wire 20 may have the form of one curved line 208 connecting between the inspection pads 202. The curved line 208 may have a predetermined or preselected form as illustrated in FIG. 4 or it may be a free-form curved line 208 as illustrated in FIG. 5.

Figure 6:
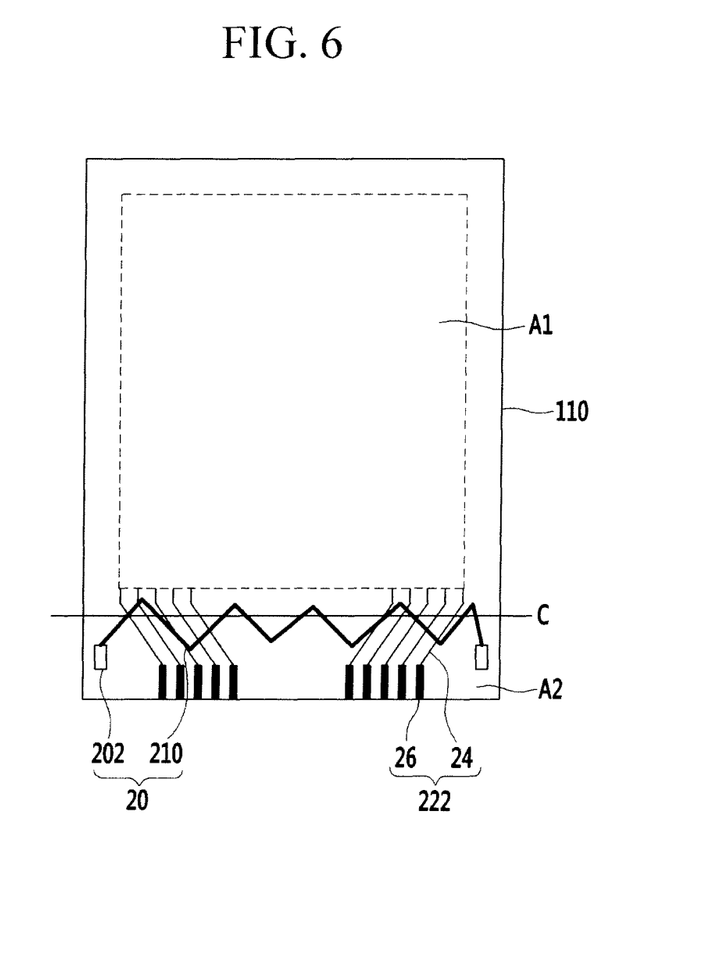

Further, as illustrated in FIG. 6, the inspection wire 20 may be formed by a plurality of cross lines 210 inclined at a predetermined or preselected slope relative to the pad wires 222 (e.g., inclined at angle greater than 0 with respect to the pad wires 222).

According to the exemplary embodiment shown in FIG. 1, when the inspection wire 20 is formed to cross the cutting line C, it can be easily confirmed that the lower pad wire 222 is cut when an upper temporary protective film is cut along the cutting line C by a cutter.

Hereinafter, an interlayer structure of the organic light emitting diode display according to the exemplary embodiment shown in FIG. 1 will be described with reference to FIG. 7.

Figure 7:
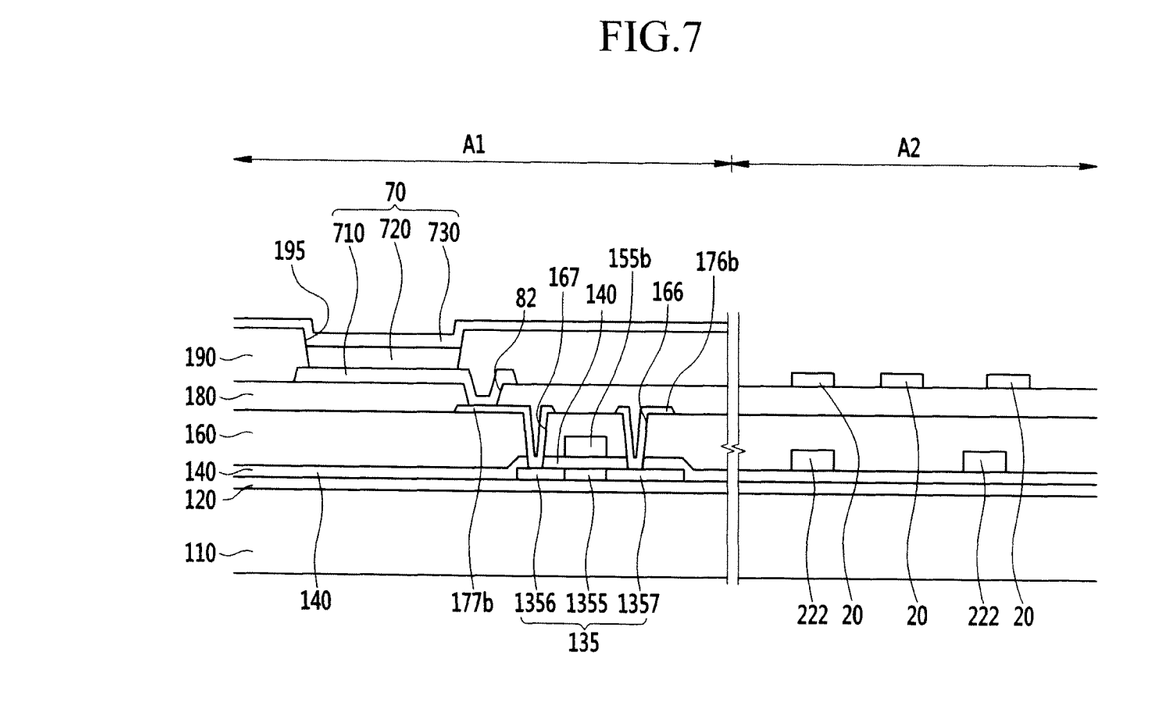
FIG. 7 is a cross-sectional view illustrating the organic light emitting diode display according to the exemplary embodiment of FIG. 1.

FIG. 7 is a cross-sectional view illustrating the organic light emitting diode display according to the exemplary embodiment shown in FIG. 1.

A switching transistor and a driving transistor of the organic light emitting diode display according to the exemplary embodiment have a similar interlayer structure, and therefore the driving transistor will be mainly described and further description of the switching transistor will be omitted.

As illustrated in FIG. 7, the organic light emitting diode display according to the exemplary embodiment includes a substrate 110, a buffer layer 120 on the substrate 110, and a semiconductor 135 on the buffer layer 120.

The substrate 110 may be a transparent insulating substrate formed of, for example, glass, quartz, ceramic, plastic, or the like, and the substrate 110 may be a metallic substrate formed of, for example, stainless steel, or the like.

The buffer layer 120 may be a single layer of silicon nitride (SiNx) or a double layer structure in which silicon nitride (SiNx) and silicon oxide ($SiO_2$) are laminated. The buffer layer 120 serves to planarize a surface of the substrate 110 while preventing or reducing unnecessary components such as impurities and/or moisture from infiltrating.

The semiconductor 135 may be formed of polysilicon on the buffer layer 120.

The semiconductor 135 is divided into a source region 1356 and a drain region 1357 that are each formed at a side of a channel region 1355. The channel region 1355 of the semiconductor 135 is polysilicon, that is, an intrinsic semiconductor in which impurity is not doped. The source region 1356 and the drain region 1357 of the semiconductor 135 are polysilicon, for example, an impurity semiconductor in which conductive impurity is doped.

The impurity that is doped in each of the source region 1356 and the drain region 1357 may be any one of a p-type impurity or an n-type impurity.

A gate insulating layer 140 is formed on the semiconductor 135.

The gate insulating layer 140 may be a single layer or a multi layer including at least one of tetra ethyl ortho silicate (TEOS), silicon nitride, and silicon oxide.

A gate electrode 155b and the pad wire 222 are formed on the gate insulation layer 140. The pad wire 222 is connected with the gate line (not illustrated) that is connected with the gate electrode 155b.

The pad wire 222 and the gate electrode 155b may each be a single layer or a multi layer that includes a low resistance material or a material with strong corrosion resistance such as Al, Ti, Mo, Cu, Ni, or an alloy thereof. For example, the pad wire 222 and the gate electrode 155b may each include a triple layer of Ti/Cu/Ti, Ti/Ag/Ti, and Mo/Al/Mo.

A first interlayer insulating layer 160 is on the gate electrode 155b and the pad wire 222.

The first interlayer insulating layer 160 may be a single layer or a multi layer including tetra ethyl ortho silicate (TEOS), silicon nitride, silicon oxide, and the like, similar to the gate insulating layer 140.

A source electrode 177b and a drain electrode 176b are on the first interlayer insulating layer 160 and the source electrode 177b and the drain electrode 176b are connected with a source region 1356 and a drain region 1357, respectively, through contact holes 167 and 166.

The source electrode 177b and the drain electrode 176b may each be a single layer or a multi layer including a low resistance material or a material with strong corrosion resistance such as Al, Ti, Mo, Cu, Ni, or an alloy thereof. For example, the source electrode 177b and the drain electrode 176b may each be a triple layer of Ti/Cu/Ti, Ti/Ag/Ti, and Mo/Al/Mo.

The gate electrode 155b, the source electrode 177b, and the drain electrode 176b form a thin film transistor (TFT) with the semiconductor 135. The channels of the thin film transistor are each formed in the semiconductor 135 between the source electrode 177b and the drain electrode 176b.

A second interlayer insulating layer 180 having an opening 82 is on the source electrode 177b and the drain electrode 176b.

The second interlayer insulating layer 180 may be a single layer or a multi layer including tetra ethyl ortho silicate (TEOS), silicon nitride, silicon oxide, and the like, similar to the first interlayer insulating layer 160.

A first electrode 710 and the inspection wire 20 are on the second interlayer insulating layer 180. The first electrode 710 may be an anode electrode of the organic light emitting element LD of FIG. 2.

Referring to FIGS. 1 and 7, the inspection wire 20 includes the pair of input terminals 202, a plurality of cross lines 204 connecting between the input terminals, and a plurality of connection lines 206.

At least one cross line 204 is disposed to cross the cutting line C and the connection line 206 connects between the adjacent cross lines 204.

A pixel define layer 190 having an opening 195 exposing the first electrode 710 is formed on the second interlayer insulating layer 180.

The pixel define layer 190 has the opening 195 exposing the first electrode 710. The pixel define layer 190 may be formed from a resin such as polyacrylates, polyimides, and the like, and silica-based inorganic matters, and the like.

An organic emission layer 720 is on the first electrode 710 at the opening 195.

The organic emission layer 720 is a multi-layer including an emission layer and at least one of a hole-injection layer (HIL), a hole-transporting layer (HTL), an electron-transporting layer (ETL), and an electron-injection layer (EIL).

When the organic emission layer 720 includes all of the above-described layers, the hole-injection layer (HIL) is on (e.g., directly on) the first electrode 710 (e.g., the anode electrode) and the hole-transporting layer, the emission layer, the electron-transporting layer, and the electron-injection layer may be sequentially laminated thereon.

A second electrode 730 is formed on the organic emission layer 720 and the pixel define layer 190. The second electrode 730 may be a cathode electrode of the organic light emitting element LD of FIG. 2.

As shown in FIG. 7, the first electrode 710, the organic emission layer 720 and the second electrode 730 form an organic light emitting element 70.

The organic light emitting diode display may have any one structure of a front display type, a rear display type, and a double surface display type depending upon the direction (or directions) in which the organic light emitting element 70 emits light.

In the case of the front display type, the first electrode 710 is a reflective layer and the second electrode 730 is a transflective layer or a transmissive layer. On the other hand, in the case of the rear display type, the first electrode 710 is a transflective layer and the second electrode 730 is formed of a reflective layer. In addition, in the case of the double surface display type, the first electrode 710 and the second electrode 730 are each a transparent layer or a transflective layer.

The reflective layer and the transflective layer include at least one of magnesium (Mg), silver (Ag), gold (Au), calcium (Ca), lithium (Li), chromium (Cr), and aluminum (Al) or an alloy thereof. The reflective and transflective properties are determined by a thickness of each layer and the transflective layer may be formed at a thickness of 200 nm or less. The thinner the thickness is, the higher the transmittance of light becomes. However, when the thickness is too thin, resistance is increased.

The transparent layer includes materials, such as indium tin oxide (ITO), indium zinc oxide (IZO), zinc oxide (ZnO), indium oxide ($In_2O_3$), and the like.

A sealing member 200 is on the second electrode 730. The sealing member 200 may include an inorganic layer or an organic layer, which may be alternately laminated. The sealing member 200 protects a pixel from external air.

The foregoing exemplary embodiment describes that the inspection wire 20 is on the second interlayer insulating layer 180 and includes the same metal as the second electrode 730. However, the inspection wire 20 is used to inspect that the pad wire 222 is cut at the time of cutting a temporary upper protective film 400 and the inspection wire may include all of the metal layers on the pad wire 222.

Therefore, the inspection wire 20 may include the same materials and be on the same layer as the source electrode 177b and the drain electrode 176b.

The additional embodiments will be described in detail with reference to FIGS. 8 to 12.

Figure 8:
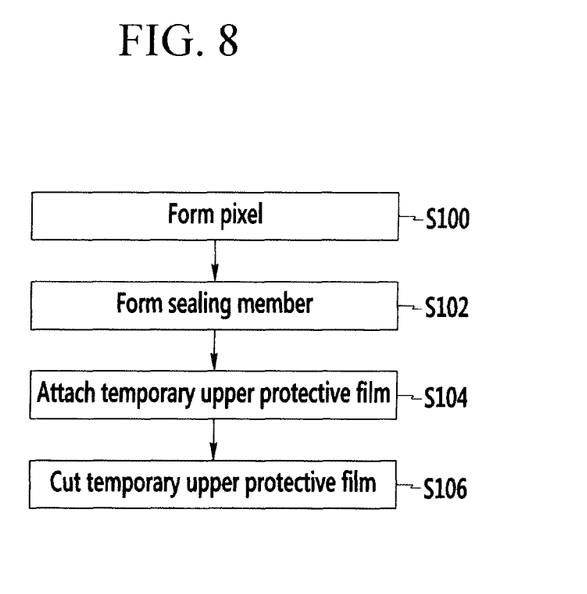
FIG. 8 is a flow chart illustrating a sequence of manufacturing an organic light emitting diode display according to an exemplary embodiment.

FIG. 8 is a flow chart illustrating a sequence of manufacturing an organic light emitting diode display according to an exemplary embodiment.

As illustrated in FIG. 8, in the method of manufacturing the organic light emitting diode display according to an exemplary embodiment, a pixel PX is formed in a display area of a substrate (S100). In this case, the peripheral area A2 is provided with the pad wire 222 and the inspection wire 20 along with the pixel PX. The pixel PX may include a circuit as illustrated in FIG. 2 and may have an interlayer structure as illustrated in FIG. 3.

Next, the sealing member 200 that seals the pixel PX of the display area A1 is formed (S102). Further, the temporary upper protective film 400 (as shown in FIGS. 10 and 12) covering the display area and the peripheral area is attached (S104).

Figure 10:
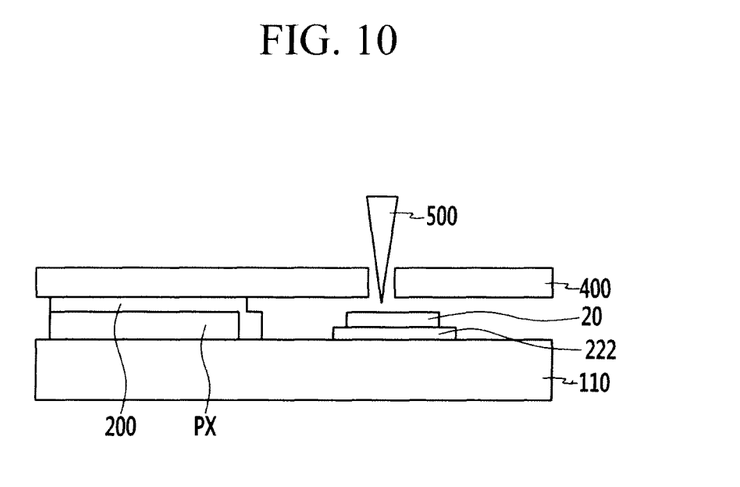
Figure 12:
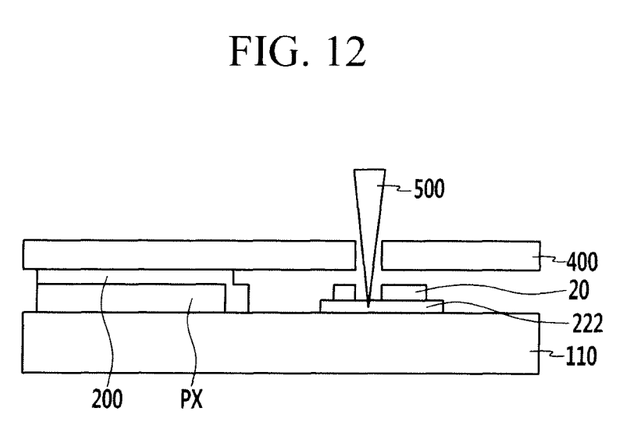

Next, the temporary upper protective film 400 disposed in the peripheral area A2 is removed by cutting the temporary upper protective film 400 using a cutter 500 (S106), as illustrated in FIGS. 10 and 12.

As such, when the temporary upper protective film 400 is cut using the cutter 500, the plurality of pad wires on the lower portion may be cut. However, when the inspection wire is formed according to the exemplary embodiment, it can be easily determined whether any of the plurality of pad wires have been cut to facilitate identification of defective panels.

These additional features will be described in detail with reference to FIGS. 9 to 12.

Figure 9:
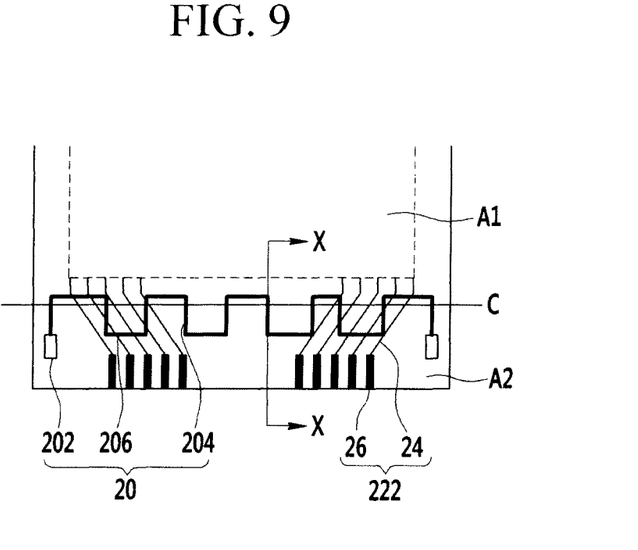
FIGS. 9 and 10 are an arrangement diagram of an organic light emitting diode display and a cross-sectional view of the organic light emitting diode display of FIG. 9 taken along the line X-X, respectively, schematically illustrating the organic light emitting diode display according to an exemplary embodiment having been desirably cut.

FIGS. 9 and 10 are an arrangement diagram of an organic light emitting diode display and a cross-sectional view of the organic light emitting diode display of FIG. 9 taken along the line X-X, respectively, schematically illustrating the organic light emitting diode display according to an exemplary embodiment having been desirably cut.

Figure 11:
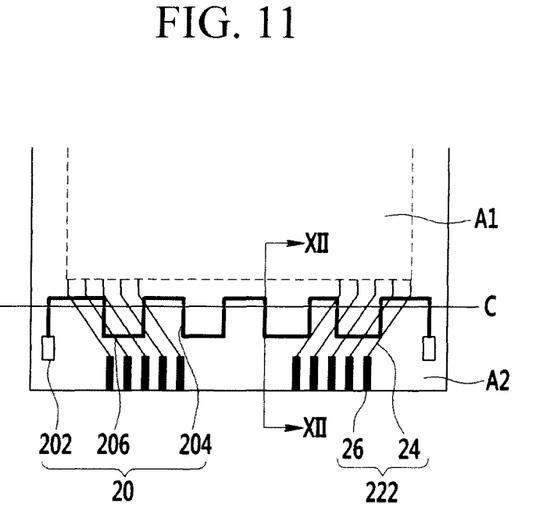
FIGS. 11 and 12 are an arrangement diagram an organic light emitting diode display and a cross-sectional view of the organic light emitting diode display of FIG. 11 taken along the line XII-XII, respectively, schematically illustrating the organic light emitting diode display according to an exemplary embodiment having been defectively cut.

FIGS. 11 and 12 are an arrangement diagram of an organic light emitting diode display and a cross-sectional view of the organic light emitting diode display of FIG. 11 taken along the line XII-XII, respectively, schematically illustrating the organic light emitting diode display according to the exemplary embodiment having been defectively cut.

As illustrated in FIGS. 9 to 12, the display area A1 of the substrate 100 is provided with the pixels PX and is provided with the sealing member 200 covering the pixel PX. Further, the peripheral area A2 of the substrate 100 is provided with the plurality of pad wires 222, an insulating layer 5 is on the pad wire 222, and the inspection wire 20 is on the insulating layer 5.

The insulating layer 5 may be a gate insulating layer, an interlayer insulating layer, a protective layer, and the like, of the display area.

The temporary upper protective film 400 is attached to the entire surface of the substrate including the display area A1 and the peripheral area A2.

The temporary upper protective film 400 may be cut using the cutter 500. For example, when the cutter 500 accurately (or desirably) cuts the temporary upper protective film 400, as illustrated in FIGS. 9 and 10, the lower plurality of pad wires 222 are not damaged and only the temporary upper protective film 400 may be removed.

However, as illustrated in FIGS. 11 and 12, when the cutter 500 is deeply inserted over the thickness of the temporary upper protective film 400, the cutter 500 passes over the plurality of pad wires 222 below the cutting line C to cut the plurality of pad wires 222. The plurality of pad wires 222 cross the cutting line C, such that when the plurality of pad wires 222 is cut by the cutter 500, the external driving signal is not transferred to the pixel PX of the display area through the pad wire 222.

However, as in exemplary embodiments, when the inspection wire 20 is formed on the plurality of pad wires 222, a defective panel resulting from the cutting of the pad wires 222 may be easily identified.

That is, when the cutter 500 is deeply inserted to cut the lower plurality of pad wires 222, the cross line 204 of the inspection wire 20, which is positioned closer to the temporary upper protective film 400 than the pad wires 222, is cut first. Therefore, it can be appreciated that, when an electrical signal is applied to the inspection pads 202 of the inspection wire 20, the measured resistance will be infinite when one or more of the cross lines 204 of the inspection wire 20 is disconnected.

When the inspection wire 20 is disconnected, the cutter 500 may have been excessively inserted and may have also cut the lower plurality of pad wires 222, thereby resulting in a defective panel. As such, a defective panel may be easily determined using the inspection wire 20, and therefore the inspection time for identifying or selecting defective panels may be shortened.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode display, comprising:
    a substrate comprising a display area configured to display an image and a peripheral area surrounding the display area;
    a plurality of pad wires at the peripheral area of the substrate; and
    an inspection wire having a zigzag form on the plurality of pad wires.

2. The organic light emitting diode display of claim 1, further comprising:
    an upper protective film on the display area,
    wherein the upper protective film is on the plurality of pad wires, and the inspection wire comprises a portion crossing one side of the upper protective film on the plurality of pad wires.

3. The organic light emitting diode display of claim 2, wherein:
    the inspection wire comprises:
        a pair of inspection pads;
        a plurality of cross lines between the inspection pads; and
        a plurality of connection lines connecting adjacent cross lines.

4. The organic light emitting diode display of claim 3, wherein the plurality of cross lines are parallel with the plurality of pad wires.

5. The organic light emitting diode display of claim 2, wherein:
    the inspection wire comprises:
        a pair of inspection pads; and
        a plurality of cross lines connecting between the inspection pads and inclined at angle greater than 0 with respect to the plurality of pad wires.

6. The organic light emitting diode display of claim 2, wherein:
    the inspection wire comprises:
        a pair of inspection pads; and
        a portion connecting the inspection pads and having the form of a curved line.

7. The organic light emitting diode display of claim 1, further comprising:
    an insulating film between the plurality of pad wires and the inspection wire.

8. The organic light emitting diode display of claim 1, wherein the substrate is a flexible substrate.

* * * * *